United States Patent
Chen et al.

(10) Patent No.: US 7,144,799 B2
(45) Date of Patent: Dec. 5, 2006

(54) METHOD FOR PRE-RETAINING CB OPENING

(75) Inventors: Yinan Chen, Taipei (TW); Jeng-Ping Lin, Dayuan Township, Taoyuan County (TW); Feng-Chuan Lin, Kaohsiung (TW)

(73) Assignee: Nan Ya Technology Corporation, Taipei (TW)

( * ) Notice: Subject to any disclaimer, the term of this patent is extended or adjusted under 35 U.S.C. 154(b) by 24 days.

(21) Appl. No.: 11/101,007

(22) Filed: Apr. 6, 2005

(65) Prior Publication Data

US 2006/0228845 A1    Oct. 12, 2006

(51) Int. Cl.
*H01L 21/44* (2006.01)
(52) U.S. Cl. .................... 438/597; 438/666; 438/694; 438/787; 257/E21.002

(58) Field of Classification Search .............. 438/597, 438/666, 694, 787
See application file for complete search history.

(56) References Cited

U.S. PATENT DOCUMENTS

| | | | | |
|---|---|---|---|---|
| 6,057,581 | A * | 5/2000 | Doan .................... | 257/401 |
| 6,808,984 | B1 * | 10/2004 | Chen .................... | 438/256 |
| 6,821,872 | B1 * | 11/2004 | Liao et al. ............. | 438/586 |
| 6,977,210 | B1 * | 12/2005 | Chen et al. ............ | 438/597 |
| 2005/0085072 | A1 * | 4/2005 | Kim et al. ............. | 438/684 |
| 2005/0239282 | A1 * | 10/2005 | Chen et al. ............ | 438/629 |

* cited by examiner

*Primary Examiner*—Zandra V. Smith
*Assistant Examiner*—Christy Novacek

(57) ABSTRACT

Disclosed is a method for pre-retaining CB opening in a DRAM manufacture process, wherein a CB opening is filed with a photo-resist layer and an LPD oxidation layer that is filled at room temperature to avoid damaging caused by conventional etching techniques. The LPD oxidation layer and the photo-resist are replaced easily by a polysilicon layer and a BPSG layer.

20 Claims, 5 Drawing Sheets

METHOD FOR PRE-RETAINING CB OPENING

FIELD OF THE INVENTION

The present invention relates to a DRAM manufacturing process and, more particularly, to a method for pre-retaining CB openings in a DRAM manufacturing process.

BACKGROUND OF THE INVENTION

Dynamic random access memory (DRAM) is a widely used IC component, particularly in the IT products. Conventional DRAM usually comprises a plurality of bit lines and a plurality of word lines, cross-intersecting with each other.

The recent IC manufacturing technology moves towards shrinking the width of the interconnecting lines to reduce the horizontal size of IC. As this increases the aspect ratio, manufacturing the vertical size of IC becomes more difficult.

Conventionally, it is easy to damage the gate conductor (GC), i.e., word line, during the manufacturing of bit line opening. This type of damage will cause the short-circuit problem between word lines and bit lines, and the open-circuit problem of bit line opening.

SUMMARY OF THE INVENTION

The first object of the present invention is to provide a method to avoid the short-circuit problem between word lines and bit lines.

The second object of the present invention is to provide a method to avoid the open-circuit problem of the bit line openings.

To achieve the aforementioned objects, the present invention provides a method for pre-retaining CB openings. The present invention discloses a method comprising the following steps: forming a plurality of gate conductors (GC) on a substrate, with a gap between two adjacent GCs, forming a photo-resist layer on the GCs and the gaps between them, removing a part of the photo-resist layer to expose a part of substrate and part of GC surfaces, while keeping the gaps and part of the GC surfaces still covered with the photo-resist layer, using the liquid phase deposition (LPD) method to form an oxidation layer at the locations of removed photo-resist layer, removing the photo-resist layer on the pre-retained gaps and part of the GC surfaces to form a bit line CB opening, forming a polysilicon layer in the bit line CB opening and the LPD oxidation layer, removing the polysilicon layer to expose the LPD oxidation layer, removing the LPD oxidation layer to expose a part of substrate and part of GC surfaces, uniformly forming a nitrogen compound layer on the exposed substrate and GC surfaces, forming a BPSG layer on the nitrogen compound layer, and finally, removing the BPSG layer to expose the nitrogen compound layer on top of the polysilicon layer.

The method disclosed in the present invention can avoid the short-circuit problem between the bit lines and word lines, and the open-circuit problem of bit line CB openings.

These and other objects, features and advantages of the invention will be apparent to those skilled in the art, from a reading of the following brief description of the drawings, the detailed description of the preferred embodiment, and the appended claims.

DETAILED DESCRIPTION OF THE INVENTION

Figure 1A:
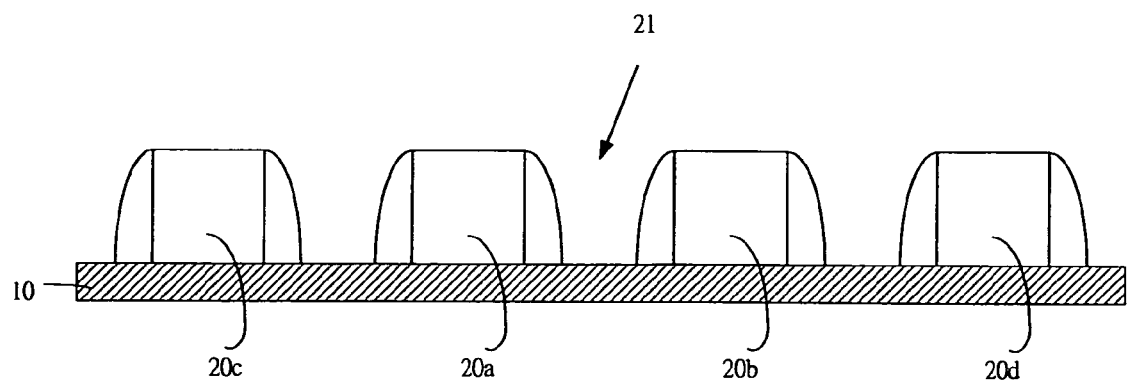
FIGS. 1A-1M show the steps of the method for pre-retaining CB openings in the DRAM manufacturing process.

As shown in FIG. 1A, a plurality of gate conductors (GC) 20a, 20b, 20c 20d are formed on a substrate 10. A gap is re-retained between each pair of 20a and 20b, 20b and 20c, 20c and 20d. Gap 21 denotes the gap between 20a and 20b.

Figure 1B:
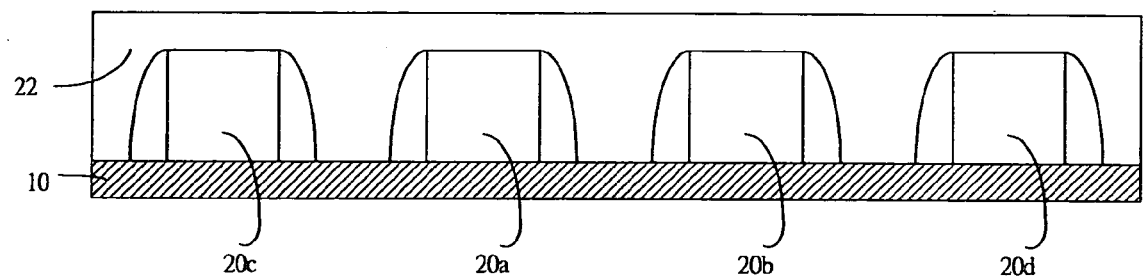

A photo-resist layer 22 is formed on GCs 20a, 20b, 20c, 20d and the gaps between GCs, including gap 21, so that GCs 20a, 20b, 20c, 20d are entirely covered with photo-resist layer 22, as shown in FIG. 1B.

Figure 1C:
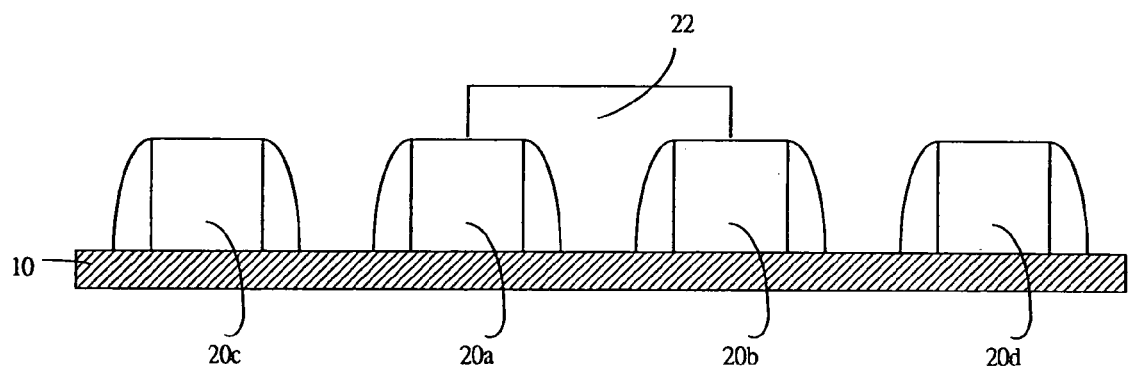

In the next step, as shown in FIG. 1C, a part of photo-resist layer 22 is removed to expose the gap, i.e., substrate 10, between 20c and 20a, the gap between 20b and 20d, GC 20c, GC 20d, the left half of GC 20a, and the right half of GC 20b. The remaining photo-resist layer 22 still fills gap 21, and covers the right half of GC 20a and the right half of GC 20b.

It is worth noticing that photo-resist layer 22 is easy for removal in the above step, so that gap 21 can use photo-resist layer 22 in FIG. 1C to pre-retain a bit line CB opening in order to avoid the drawbacks of etching techniques used in conventional bit line CB opening manufacturing process, which usually causes damage to the surfaces of the right half of GC 20a and the left half of GC 20b. Therefore, the remaining photo-resist layer 22 is where the bit line CB opening of the DRAM will be located.

The removal of photo-resist layer 22 can be accomplished by either a dry approach or a wet approach. The wet approach usually uses the SPM to remove photo-resist layer 22. The SPM is a mixed solution of $H_2SO_4$ and $H_2O_2$.

Figure 1D:
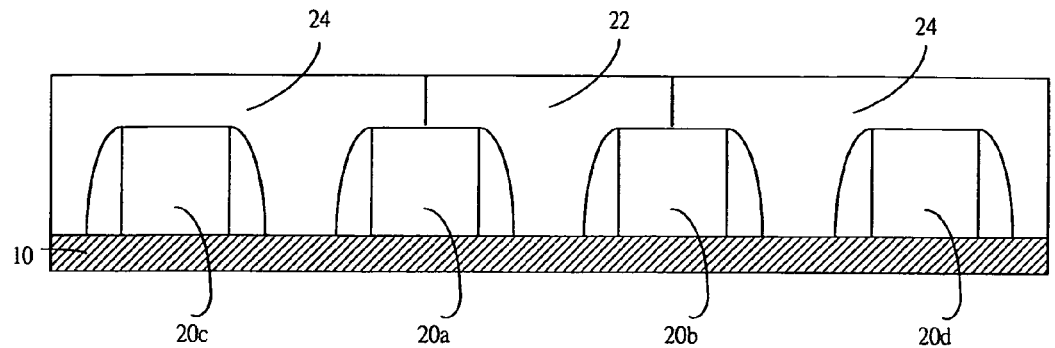

As shown in FIG. 1D, the next step is to form a liquid phase deposition (LPD) oxidation layer 24 at around room temperature (25–40° C.) at the exposed location of the removed photo-resist layer 22. The exposed locations of the removed photo-resist layer 22 refer to the gap between 20a and 20c, the gap between 20b and 20d, the exposed GCs 20c, 20d, and the exposed part of GCs 20a, 20b, as shown in FIG. 1C. It is worth noticing that the height of LPD oxidation layer 24 could be slightly lower than that of photo-resist layer 22.

Although photo-resist layer 22 is prone to damage in an environment with a slightly high temperature, the bit line opening pre-retained by photo-resist layer 22 is, however, still well preserved during the aforementioned step because the aforementioned step of forming LPD oxidation layer 24 is carried out at room temperature.

Figure 1E:
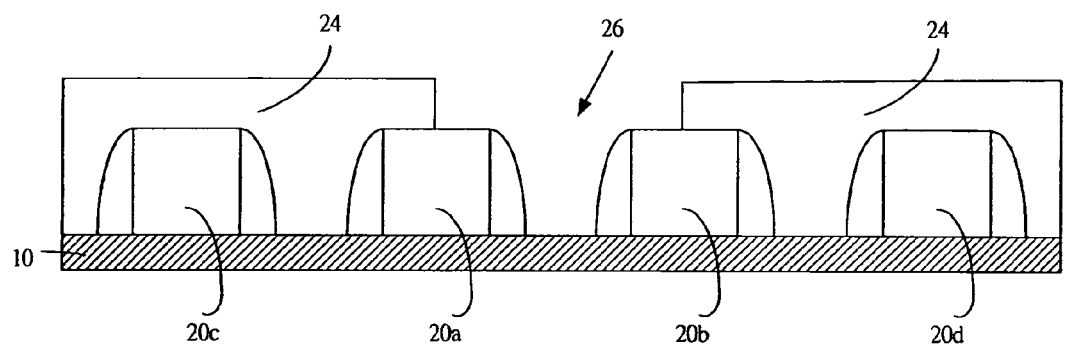

The next step, as shown in FIG. 1E, is to remove the remained photo-resist layer 22 on gap 21 and partly covered GC 20a, 20b. This step forms a bit line CB opening 26.

Figure 1F:
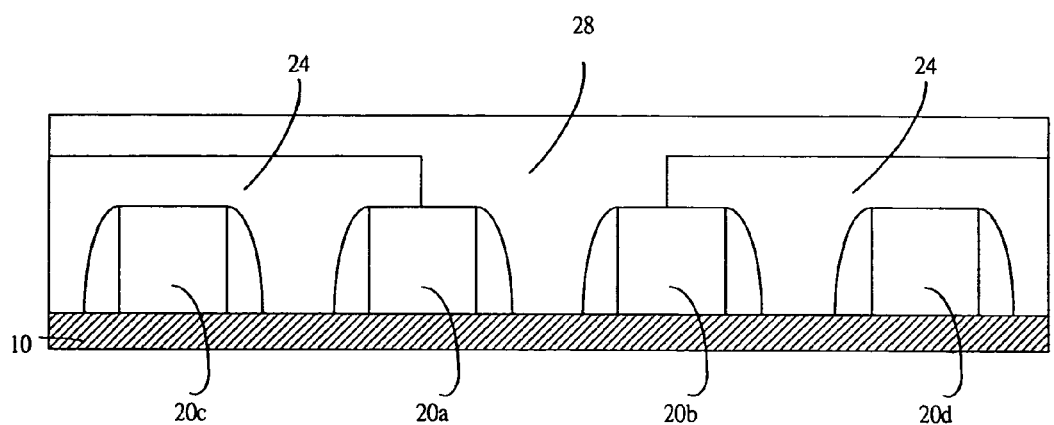

Then, as shown in FIG. 1F, a polysilicon layer 28 is formed on bit line CB opening 26 and LPD oxidation layer 24.

Figure 1G:
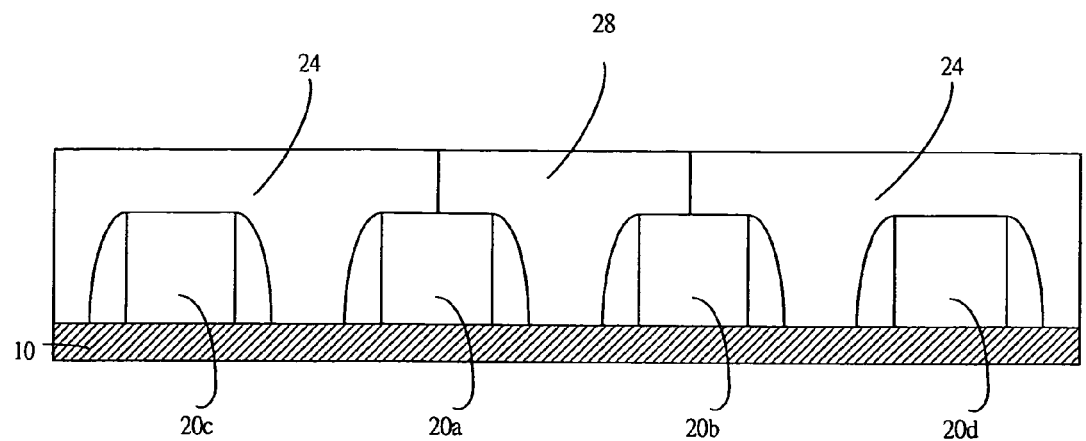

The next step is to remove a part of polysilicon layer 28 to expose the upper surface of LPD oxidation layer 24 at the edge adjacent to filled-with-polysilicon bit line CB opening 26, as shown in FIG. 1G. The removal of polysilicon layer 28 is usually accomplished by chemical mechanical polishing (CMP) or etching.

Figure 1H:
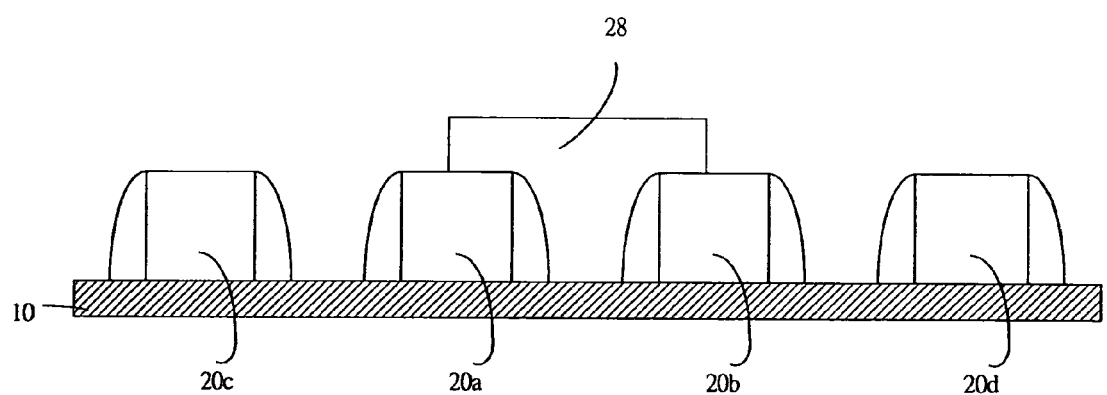

As shown in FIG. 1H, the next step is to remove LPD oxidation layer 24 to expose a part of substrate 10 and a part of GCs. The removal of LPD oxidation layer 24 can be accomplished by diluted hydrofluoric acid (DHF) or buffered hydrofluoric acid (BHF). The DHF is a mixed solution of hydrofluoric acid and water at the ratio of 1:30 to 1:500, and the BHF is a mixed solution of ammonium fluoride, hydrofluoric acid, and water. The ratio between ammonium fluoride and hydrofluoric acid is 6:1 to 5:1.

Figure 1I:
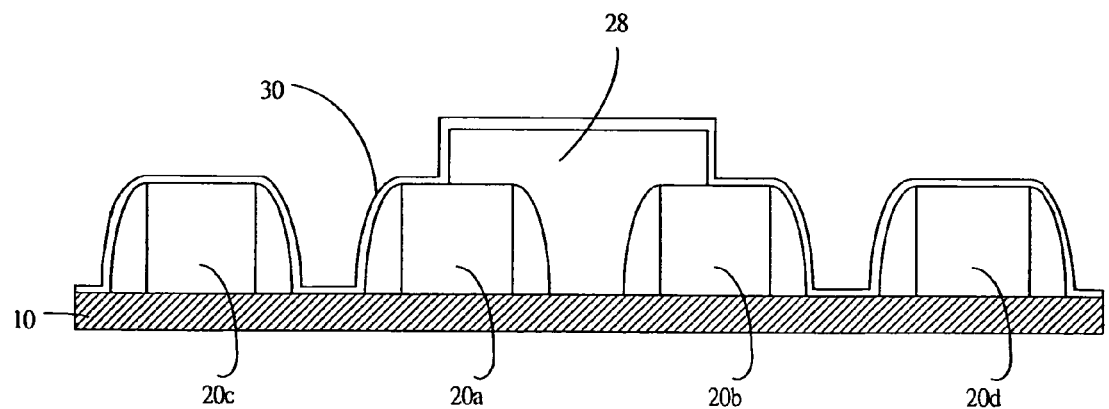

The next step, as shown in FIG. 1I, is to form a nitrogen compound layer 30, which may have a thickness of 120Å±10%, on polysilicon layer 28 and on the exposed surfaces of substrate 10 and GCs 20$c$, 20$d$, and part of GCs 20$a$, 20$b$.

Figure 1J:
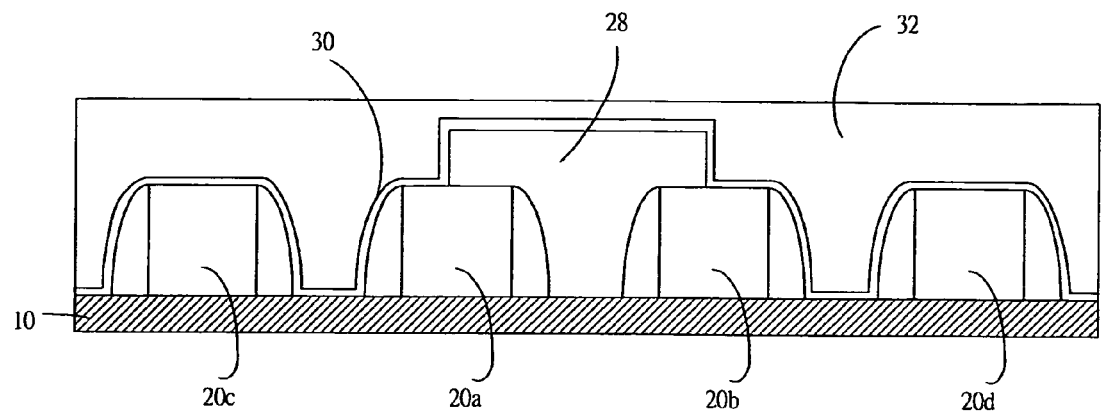
Figure 1K:
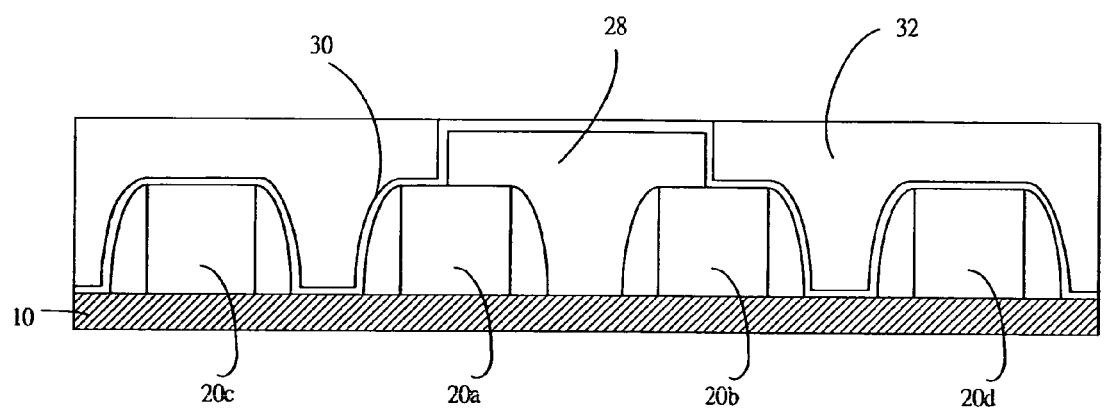

The next step, as shown in FIG. 1J, is to form a BPSG layer 32 on nitrogen compound layer 30, followed by the step of removing BPSG layer 32 to expose nitrogen compound layer 30 on top of polysilicon layer 28, as shown in FIG. 1K.

Figure 1L:
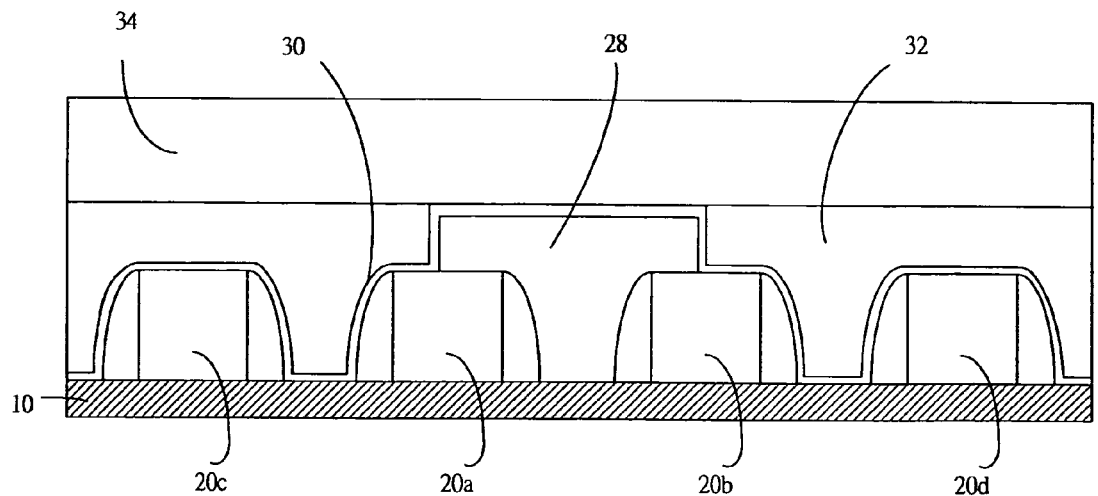
Figure 1M:
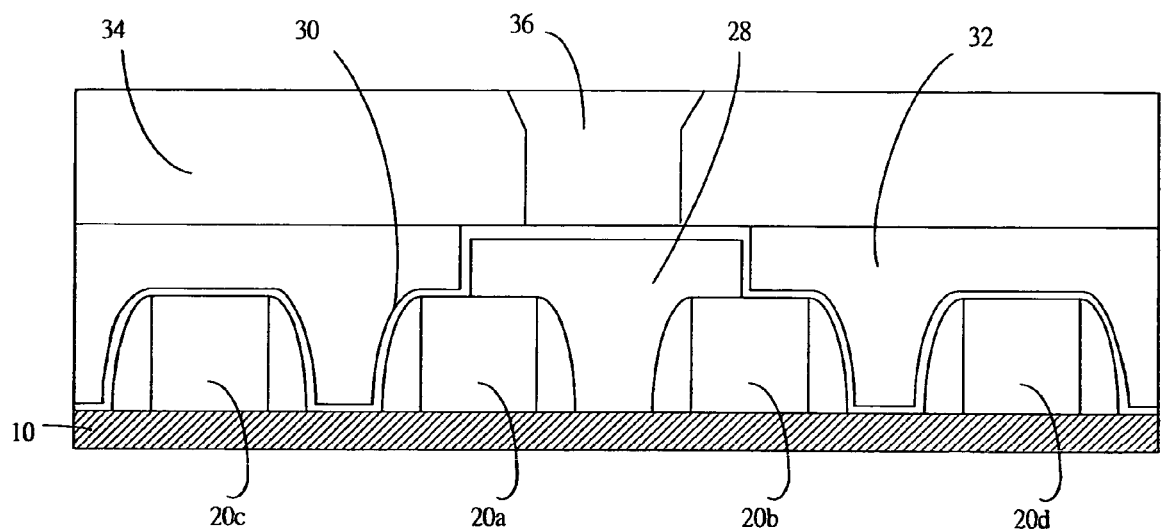

Then, a tetra-ethyl-oetho-silicate (TEOS) layer 34 is formed on the exposed nitrogen compound layer 30 on top of polysilicon layer 28, and BPSG layer 32, as shown in FIG. 1L. And finally, as shown in FIG. 1M, a tungsten plug 36 is formed inside TEOS layer 34 on top of polysilicon layer 28.

From the aforementioned disclosure, the present invention, using an LPD oxidation layer 24 and photo-resist layer 22 to pre-retain a bit line CB opening, does not require etching for manufacturing bit line CB opening, as conventional techniques. Therefore, the present invention avoids the potential damage on the surface of the right half of GC 20$a$ and the surface of left half of GC 20$b$ caused by etching. This also avoids the short-circuit problem between bit lines and word lines, as well as the open-circuit problem of bit line CB openings.

While the invention has been described in connection with what is presently considered to the most practical and preferred embodiment, it is to be understood that the invention is not to be limited to the disclosed embodiment, but on the contrary, is intended to cover various modifications and equivalent arrangement included within the spirit and scope of the appended claims.

What is claimed is:

1. A method for pre-retaining bit line CB opening, comprising the following steps:
   providing a substrate;
   forming a plurality of gate conductors (GCs) on said substrate, with a gap between each pair of adjacent GCs;
   forming a photo-resist layer on said GCs and said gaps;
   removing a part of said photo-resist layer to expose a part of said substrate and a part of said GCs, said photo-resist layer still partially covering two adjacent GCs and filling the gap between said two partially covered GCs;
   forming a sacrifice layer at the locations of said removed photo-resist layer;
   removing said photo-resist layer on said filled gap and said partially covered GCs to form a bit line CB opening;
   forming a polysilicon layer in said bit line CB opening and on said sacrifice layer;
   removing said polysilicon layer to expose said sacrifice layer;
   removing said sacrifice layer to expose a part of said substrate and a part of said GCs;
   uniformly forming a nitrogen compound layer on said polysilicon layer, said exposed substrate and said exposed GCs;
   forming a BPSG layer on said nitrogen compound layer; and
   removing said BPSG layer to expose said nitrogen compound layer on top of said polysilicon layer.

2. The method as claimed in claim 1 further comprising the following steps after the step of removing said BPSG layer:
   forming a trta-ethyl-oetho-silicate (TEOS) layer on said exposed nitrogen compound layer and said BPSG layer; and
   forming a tungsten plug inside said TEOS layer on top of said polysilicon layer.

3. The method as claimed in claim 1, wherein said photo-resist layer is removed by either a dry or wet method.

4. The method as claimed in claim 3, wherein said wet method uses SPM to remove said photo-resist layer, and said SPM is a mixed solution of $H_2SO_4$ and $H_2O_2$.

5. The method as claimed in claim 1, wherein said sacrifice layer is a liquid phase deposition (LPD) oxidation layer.

6. The method as claimed in claim 5, wherein said LPD oxidation layer is formed at around 25–40° C.

7. The method as claimed in claim 5, wherein said LPD oxidation layer is removed by either diluted hydrofluoric acid or buffer hydrofluoric acid.

8. The method as claimed in claim 7, wherein said diluted hydrofluoric acid is a mixed solution of hydrofluoric acid and water at the ratio of 1:30 to 1:500.

9. The method as claimed in claim 7, wherein said buffered hydrofluoric acid is a mixed solution of ammonium fluoride, hydrofluoric acid, and water, and the ratio between ammonium fluoride and hydrofluoric acid is 6:1 to 5:1.

10. The method as claimed in claim 1, wherein said removing polysilicon layer step is accomplished by either chemical mechanical polishing (CMP) or etching.

11. The method as claimed in claim 1, wherein the thickness of said nitrogen compound layer is 120Å±10%.

12. A method for pre-retaining bit line CB opening, comprising:
   providing a substrate;
   forming a plurality of gate conductors (GCs) on said substrate, with a gap between each pair of adjacent GCs;
   forming a photo-resist layer on said GCs and said gaps;
   removing a part of said photo-resist layer to expose a part of said substrate and a part of said GCs, said photo-resist layer still partially covering two adjacent GCs and filling the gap between said two partially covered GCs;
   forming a liquid phase deposition (LPD) oxidation layer at the locations of said removed photo-resist layer;
   removing said photo-resist layer on said filled gap and said partially covered GCs to form a bit line CB opening;
   forming a polysilicon layer in said bit line CB opening and on said LPD oxidation layer;
   removing said polysilicon layer to expose said LPD oxidation layer;
   removing said LPD oxidation layer to expose a part of said substrate and a part of said GCs;
   uniformly forming a nitrogen compound layer on said polysilicon layer, said exposed substrate and said exposed GCs;
   forming a BPSG layer on said nitrogen compound layer;
   removing said BPSG layer to expose said nitrogen compound layer on top of said polysilicon layer;
   forming a trta-ethyl-oetho-silicate (TEOS) layer on said exposed nitrogen compound layer and said BPSG layer; and forming a tungsten plug inside said TEOS layer on top of said polysilicon layer.

13. The method as claimed in claim 12, wherein said photo-resist layer is removed by either a dry or wet method.

14. The method as claimed in claim 13, wherein said wet method uses SPM to remove said photo-resist layer, and said SPM is a mixed solution of $H_2SO_4$ and $H_2O_2$.

15. The method as claimed in claim 12, wherein said LPD oxidation layer is formed at around 25–40° C.

16. The method as claimed in claim 12, wherein said LPD oxidation layer is removed by either diluted hydrofluoric acid or buffer hydrofluoric acid.

17. The method as claimed in claim 16, wherein said diluted hydrofluoric acid is a mixed solution of hydrofluoric acid and water at the ratio of 1:30 to 1:500.

18. The method as claimed in claim 16, wherein said buffered hydrofluoric acid is a mixed solution of ammonium fluoride, hydrofluoric acid, and water, and the ratio between ammonium fluoride and hydrofluoric acid is 6:1 to 5:1.

19. The method as claimed in claim 12, wherein said removing polysilicon layer step is accomplished by either chemical mechanical polishing (CMP) or etching.

20. The method as claimed in claim 12, wherein the thickness of said nitrogen compound layer is 120Å±10%.

* * * * *